United States Patent [19]

Peters

[11] Patent Number: 4,623,426

[45] Date of Patent: * Nov. 18, 1986

[54] LOW TEMPERATURE PROCESS FOR DEPOSITING EPITAXIAL LAYERS

[75] Inventor: John W. Peters, Malibu, Calif.

[73] Assignee: Hughes Aircraft Company, Los Angeles, Calif.

[ * ] Notice: The portion of the term of this patent subsequent to Feb. 1, 2000 has been disclaimed.

[21] Appl. No.: 700,051

[22] Filed: Feb. 8, 1985

Related U.S. Application Data

[63] Continuation of Ser. No. 391,073, Jun. 22, 1982, abandoned.

[51] Int. Cl.$^4$ ............................................. C30B 25/02
[52] U.S. Cl. ........................... 156/614; 156/DIG. 72; 427/87; 427/54.1
[58] Field of Search ..... 156/614, DIG. 72, DIG. 113; 427/54.1, 87; 204/157.1 R; 148/175

[56] References Cited

U.S. PATENT DOCUMENTS

| | | |
|---|---|---|
| 3,200,018 | 8/1965 | Grossman ........................... 148/175 |
| 3,920,860 | 11/1975 | Freller et al. ......................... 427/87 |
| 4,297,189 | 10/1981 | Smith et al. .................... 204/192 SP |
| 4,320,178 | 3/1982 | Chemla et al. ...................... 428/698 |
| 4,333,792 | 6/1982 | Smith ................................. 156/612 |
| 4,371,587 | 2/1983 | Peters ................................ 428/446 |
| 4,447,469 | 5/1984 | Peters ............................... 427/54.1 |

FOREIGN PATENT DOCUMENTS 51-54770 5/1976 Japan ................................ 427/54.1

OTHER PUBLICATIONS

Mullin et al, Jl. of Crystal Growth, 55 (1981) pp. 92–106, 10/81.
Shiosaki et al, Appl. Phys. Lett., 39(5) 9/1/81.
Translation of Sasaki Patent.
Messick, Jl. of Applied Physics, V47, 140.11, 11/76.

*Primary Examiner*—Hiram H. Bernstein
*Attorney, Agent, or Firm*—Mary E. Lachman; A. W. Karambelas

[57] ABSTRACT

The specification discloses a low temperature process for depositing an epitaxial layer of a selected oxide or a selected sulfide material on a chosen substrate. The substrate is exposed to a chosen vapor phase reactant in the presence of neutral, charge-free oxygen atoms or sulfur atoms to produce a reaction between the atomic species and the vapor phase reactant to form the desired oxide or sulfide and induce the crystalline growth thereof as an epitaxial layer on the surface of the substrate. The atomic oxygen or the atomic sulfur is formed at a low temperature by the photochemical dissociation of a selected oxygen-containing precursor or a selected sulfur-containing precursor, respectively.

13 Claims, 2 Drawing Figures

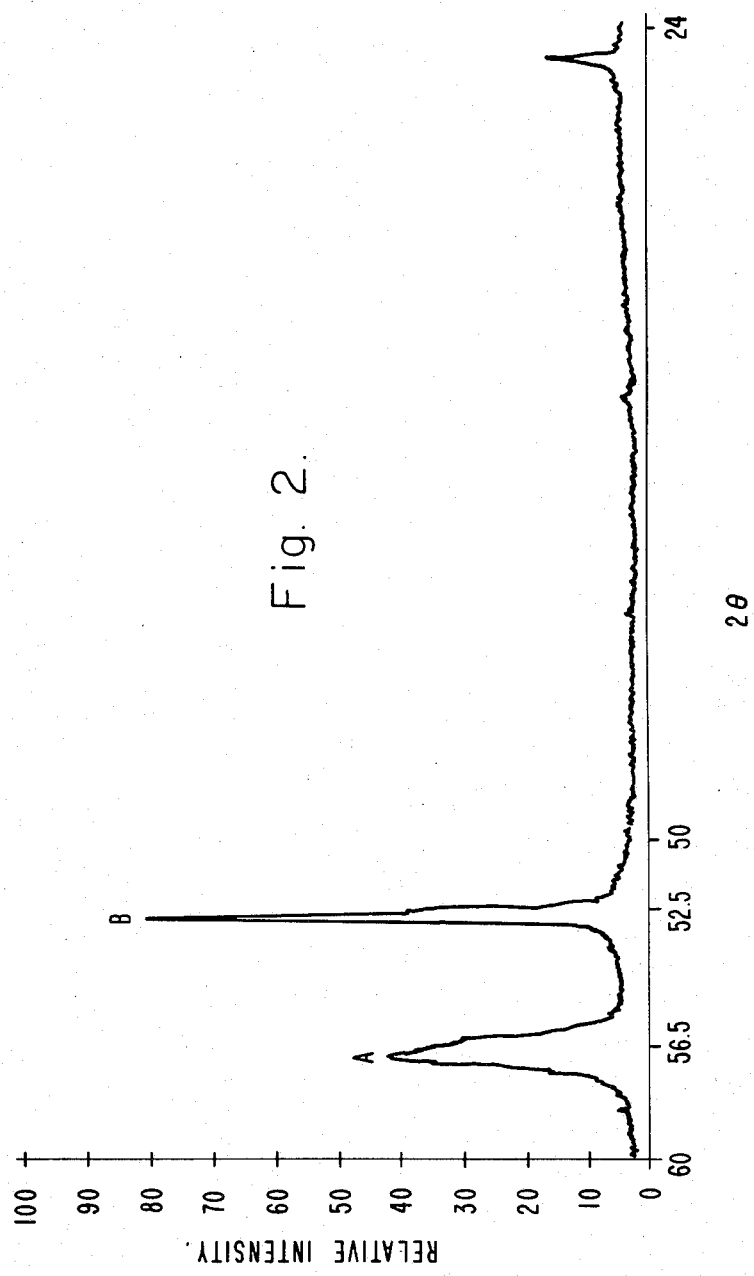

LOW TEMPERATURE PROCESS FOR DEPOSITING EPITAXIAL LAYERS

This application is a continuation of application Ser. No. 391,073, filed June 22, 1982 now abandoned.

BACKGROUND OF THE INVENTION

1. Field of the Invention

This invention relates generally to the fabrication of semiconductor devices and acousto-optical structures and, more particularly, to a low temperature process for depositing an epitaxial layer of a chosen material on a selected substrate.

2. Description of the Prior Art

In the fabrication of certain semiconductor devices and circuits, selected materials are sometimes deposited on an underlying substrate in the form of an epitaxial layer, which is a layer whose crystal orientation is induced by the substrate. The epitaxial layer may be either single crystal or polycrystalline. The substrate may be of the same or different material and structure as the deposited layer, and the substrate provides, through its lattice structure, preferred positions for the deposition of the epitaxial material. The result is that the epitaxial material forms an extension of the crystal structure of the substrate, which produces desirable electrical and optical properties in a device formed of such materials.

Epitaxial materials are used in a variety of semiconductor devices, such as: silicon-on-sapphire. (SOS) devices in which epitaxial silicon is formed on a sapphire substrate; infrared detectors, in which epitaxial mercury cadmium telluride is formed on a cadmium telluride substrate; avalanche diode detectors in which epitaxial germanium is formed on germanium or gallium arsenide substrates. In addition, epitaxial zinc oxide on a sapphire substrate is useful as an optical waveguide and in acousto-optical applications; and epitaxial lead sulfide on a silicon substrate provides the active element in infrared detectors and infrared charge-coupled devices.

In the past, the growth of epitaxial layers of various materials has been attempted by using such processes as sputtering, evaporation, high temperature liquid or vapor phase epitaxial growth, chemical vapor deposition, or a water solution chemical reaction. More specifically, oxide layers and sulfide layers have been formed using known non-reactive or reactive sputtering techniques. In a known non-reactive sputtering process, a disk of the selected material to be deposited, such as zinc oxide (ZnO) or zinc sulfide (ZnS), is bombarded in a reaction chamber with inert ions, such as argon ions, which cause the ZnO or ZnS to vaporize from the target (disk); and the vaporized ZnO or ZnS subsequently deposits on the selected substrate. Using a known reactive sputtering process, such as described by Maniv and Zangvil in the publication entitled "Controlled texture of reactively rf-sputtered ZnO thin films," in the *Journal of Applied Physics,* Vol. 49, No. 5, May 1978, pages 2787 to 2792, a disk of the selected metal, such as zinc, is bombarded in a reaction chamber with oxygen ions, which causes vaporization of the zinc from the target, and the vaporized zinc and oxygen ions then react to produce the desired oxide, which deposits on the selected substrate. However, such sputtering techniques produce polycrystalline ZnO films with crystalline orientations independent of the orientation and nature of the substrate, that is, growth is not epitaxial. In addition, ZnO films formed by sputtering often have non-smooth surfaces, which causes undesirable optical propagation losses. Further, it has been observed that polarity inversion of adjacent crystallites occurs in sputtered ZnO films, which causes reduced piezoelectric efficiency and makes such films unsuitable for acousto-optical applications.

Moreover, in both the reactive and the non-reactive sputtering processes, the bombarding ions are formed by subjecting the chosen bombarding material, such as oxygen or argon, respectively, to a radio frequency (rf) or direct current (dc) discharge. However, as a result of the exposure of the chosen bombarding material to discharge, numerous extraneous ionized and neutral particles and high energy radiation with wavelengths as low as 500 angstroms or lower are produced. These extraneous particles then bombard the surface of the substrate on which the oxide is being formed and cause damage thereto by altering the quantity and distribution of charge therein. In addition, the bombardment of the substrate surface by these particles causes the formation of additional charged particles and radiation, which may also damage the substrate. This alteration in the charge of the substrate undesirably alters the electrical performance of the substrate and any structures formed therein. The damage produced by charge bombardment and radiation bombardment is particularly noticeable when the substrate comprises an electrically sensitive device, such as a charge coupled device or a device formed of certain compound semiconductor materials, such as mercury cadmium telluride or indium antimonide.

Using a known evaporation process to form an oxide or a sulfide layer, such as zinc oxide or zinc sulfide, a source comprising the selected oxide or sulfide is placed in a reaction chamber and is raised to an elevated temperature sufficient to cause evaporation of the oxide or sulfide, which subsequently deposits on the selected substrate. Alternatively, a known reactive evaporation process may be used in which a metal source is evaporated and the evaporant is reacted with oxygen at the substrate surface to form an oxide layer. However, these evaporation processes produce ZnO films which are not epitaxial, have non-smooth surfaces, and polarity inversions, which have the disadvantages previously discussed with regard to sputtering techniques.

Using a known thermal chemical vapor deposition (CVD) process for forming an oxide layer, a metalorganic compound, such as dimethyl zinc, is thermally decomposed at the heated substrate surface in the presence of an oxygen source to produce the desired zinc oxide. However, such thermal CVD processes typically employ temperatures in excess of 500° C., which are not compatible with certain temperature-sensitive compound semiconductor materials, such as mercury cadmium telluride, which undergo decomposition at elevated temperatures.

Yet another known process for the epitaxial growth of layers of compound semiconductor materials is a liquid phase epitaxial growth process, such as described in U.S. Pat. No. 4,238,252 to Kamath and Holmes and assigned to the present assignee. In such a process, an epitaxial layer of a chosen material, such as indium phosphide or another material containing elements of Groups III and V of the periodic table, is grown by first providing a crystal growth solution of material containing the chosen elements, such as a solution of indium saturated with phosphorus. The melt is maintained in a reaction chamber at a temperature above the solution liquidus temperature (such as 750° C. for the indium and phosphorus solution). Then, the chosen substrate, such as an indium phosphide substrate, is contacted with the growth solution while the solution is cooled below its liquidus temperature. This cooling initiates the single crystal growth of the epitaxial layer of indium phosphide. However, such liquid phase epitaxial growth processes often produce epitaxial layers having high surface defect densities and voids, which result in degraded device performance. For example, point defects can lead to unwanted charge emission under high electric field conditions; and large pinholes or voids can result in poor dielectric step coverage, which causes reduced breakdown voltages or high leakage current. In addition, material grown by a liquid phase epitaxial process tends to have a degree of surface roughness which causes major optical propagation losses in acousto-optical structures and which requires that the surface of such structures be polished. Moreover, at the high temperature required in a liquid phase epitaxial growth process, an unwanted reaction can occur between the epitaxial layer, such as zinc oxide, and the substrate, such as sapphire. Further, this high temperature causes unwanted autodoping effects, in which dopants from the substrate become incorporated in the epitaxial material and alter the electrical properties thereof.

Using a known vapor phase epitaxial growth process, such as described in U.S. Pat. No. 3,657,004 to Merkel et al, an epitaxial layer is grown on the surface of a chosen substrate by exposing the substrate at high temperature to chosen vapor phase reactants. This vapor phase process uses a chemical transport reaction in which a solid or liquid substance "A" reacts with a chosen gas to form only gaseous reaction products. These products are then transported to the substrate surface where the reverse reaction occurs and the substance "A" deposits on the substrate. For example, in the process of Merkel et al, water and boron trioxide provide the transport medium for gallium arsenide at a temperature of 700° to 775° C. The vapor phase epitaxial growth of zinc oxide has been accomplished as described, for example, by C. K. Lau et al, in the publication entitled "Growth of Epitaxial ZnO Thin Films by Organometallic Chemical Vapor Deposition," the *Journal of the Electrochemical Society*, Vol. 127, No. 8, 1980, pages 1843 to 1847, using diethylzinc with $H_2O/H_2$, $N_2O/N_2$, and $CO_2/H_2$ oxidizing gas systems at temperatures of 400° C. and 730° C. However, the high temperature required for these vapor phase epitaxial growth processes causes unwanted reaction between the epitaxial layer and the substrate and unwanted autodoping, as previously discussed with regard to liquid phase epitaxial processes. Moreover, in such a vapor phase growth process, competing vapor phase reactions may occur and form zinc oxide, for example, without substrate nucleation, which becomes incorporated in the epitaxial film and reduces the crystalline quality thereof.

Finally, a water solution chemical reaction has been used to deposit an epitaxial layer of lead sulfide on a germanium substrate, as described by Davis and Norr in the publication entitled "Ge-Epitaxial-PbS Heterojunctions," in the *Journal of Applied Physics*, Vol. 37, No. 4, Mar. 15, 1966, pages 1670 to 1674. By the process of Davis et al, a water solution of sodium hydroxide and lead nitrate is prepared; the germanium substrate is immersed in the solution; thiourea is added to the solution; and the solution is allowed to sit at room temperature for 30 minutes, at the end of which the substrate has been coated with epitaxial lead sulfide. However, such solution processes tend to form layers which are highly polycrystalline and have poor surface morphology, both of which properties tend to degrade device performance.

In all of the above-described processes, the selection of the substrate material on which to deposit an epitaxial material depends on two important factors: (a) the extent of lattice mismatch between the substrate and the material to be deposited; and (b) the difference in the thermal coefficients of expansion of the substrate and of the material to be deposited. It is desirable to have minimized lattice mismatch so that the deposited material will be able to replicate the crystal structure of the substrate. It is also desirable to have closely matched thermal coefficients of expansion, particularly in the temperature range from the growth temperature of the epitaxial layer to the device operating temperature, so that crystal stress can be minimized.

However, a problem arises since some known processes for forming epitaxial layers, as previously described, use a high temperature in order to provide increased molecular motion that facilitates achieving a crystalline orientation. As the process temperature is increased, the substrate and the deposited material expand at different rates and a thermal mismatch occurs, which hinders the formation of an epitaxial layer. In addition, it is often desirable to use a low process temperature on certain compound semiconductor materials which decompose at elevated temperatures, thus losing their surface crystalline quality and defeating epitaxial deposition thereon. A low temperature is also desirable in order to avoid diffusion of doped regions formed in the substrate, as well as diffusion of the substrate material into the epitaxial layer, as previously discussed.

The present invention is directed to the alleviation of these prior art problems of high processing temperature and undesirable morphology (e.g., smoothness, pinhole density, step coverage) of epitaxially deposited materials.

SUMMARY OF THE INVENTION

With regard to the formation of an oxide layer, I have previously discovered a low temperature process for depositing an oxide layer on a given substrate which comprises exposing the substrate t.o a chosen vapor phase reactant in the presence of neutral, charge-free atomic oxygen to produce a reaction between the atomic oxygen and the vapor phase reactant to form the desired oxide, which as a layer on the substrate, as described in U.S. Pat. No. 4,371,587 assigned to the present assignee.

As a further development, I have discovered that the process of my invention disclosed in U.S. Pat. No. 4,371,587 is useful for depositing a layer of a selected oxide on the surface of a chosen substrate in the form of an epitaxial layer.

A first general purpose of the present invention is to provide a new and improved, low temperature process for forming an epitaxial layer of a high quality oxide material on the surface of a selected substrate. This process possesses most, if not all, of the advantages of the above-described prior art epitaxial oxide deposition processes, while overcoming their above-mentioned disadvantages.

I have discovered that the above-described first purpose may be accomplished by forming the epitaxial oxide layer on a chosen substrate by a low temperature process in which the substrate is exposed to a vapor phase reactant containing a chosen metal in the presence of neutral, charge-free atomic oxygen. The atomic oxygen reacts with the vapor phase reactant to form the desired oxide, which deposits as an epitaxial layer on the substrate surface.

With regard to the formation of a- sulfide layer, I have previously discovered a process for depositing a layer of a sulfide of a chosen element on the surface of a selected substrate which comprises exposing the substrate to a selected vapor phase reactant in the presence of neutral, charge-free sulfur atoms to produce a reaction between the atomic sulfur and the vapor phase reactant to form the desired sulfide, which deposits as a layer on the substrate, as described in U.S. Pat. No. 4,447,469, assigned to the present assignee.

As a further development, I have discovered that the process of my invention disclosed in U.S. Pat. No. 4,447,469 is useful for depositing a layer of a selected sulfide on the surface of a chosen substrate in the form of an epitaxial layer.

A second general purpose of the present invention is to provide a new and improved, low temperature process for forming an epitaxial layer of a high quality sulfide material on the surface of a selected substrate. This process possesses most, if not all, of the advantages of the above-described prior art epitaxial deposition processes, while overcoming their above-mentioned disadvantages.

I have discovered that the above-described second purpose of the present invention may be accomplished by forming the epitaxial sulfide layer on a chosen substrate by a low temperature process in which the substrate is exposed to a chosen vapor phase reactant containing a chosen element in the presence of neutral, charge-free sulfur atoms. The sulfur atoms react with the vapor phase reactant to form the desired sulfide, which deposits as an epitaxial layer on the chosen substrate.

Accordingly, it is a further purpose of the present invention to provide new and improved low temperature processes for inducing the epitaxial deposition of selected oxide and sulfide materials.

Another purpose is to provide new and improved processes for forming epitaxial layers of selected materials, which layers have desirable morphology, such as smoothness and step coverage, and low pinhole density.

Still another purpose is to provide processes of the type described which are performed at low temperature to minimize unwanted chemical reactions, dopant diffusion, or material decomposition in the substrate.

A further purpose is to provide a process for forming high quality crystalline zinc oxide layers epitaxially on sapphire substrates.

Yet another purpose is to provide a process for forming zinc oxide epitaxial layers with minimized optical scattering losses.

Still another purpose is to provide a process for forming high quality lead sulfide layers epitaxially on a selected substrate.

A feature of the present invention is that a low temperature photochemical vapor deposition process may be used to form the above-described epitaxial layers.

The foregoing and other advantages and features of the present invention will become more readily apparent from the following more particular description of the preferred embodiments of the invention, as illustrated in the accompanying drawings.

BRIEF DESCRIPTION OF THE DRAWINGS

FIG. 2 presents the data obtained from the X-ray diffractometer scan of an epitaxial zinc oxide layer formed on a $(01\bar{1}2)$ sapphire substrate by the process of the present invention.

DETAILED DESCRIPTION OF THE INVENTION

Figure 1:
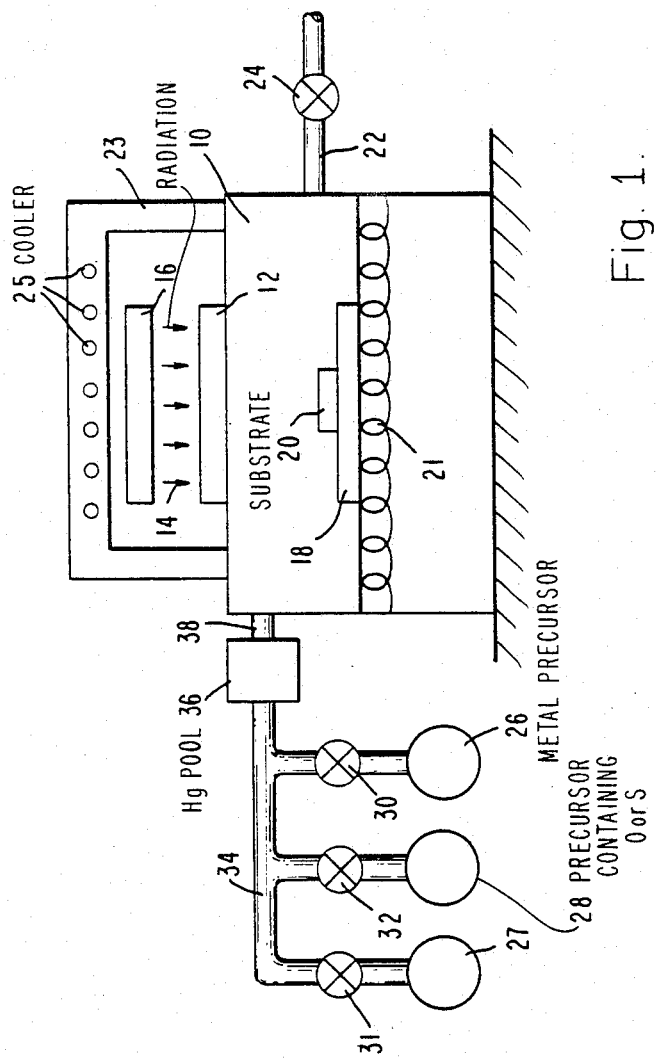
FIG. 1 illustrates, in schematic form, a preferred apparatus which may be adapted for carrying out the processes according to various embodiments of the present invention, in which neutral oxygen or sulfur atoms are formed by either the mercury photosensitized or the direct dissociation of an oxygen-containing or sulfur-containing precursor, and are reacted to form an epitaxial oxide or sulfide layer.

FIG. 1 shows, in simplified form, an apparatus suitable for implementation of various process embodiments of the present invention in which selected neutral atoms are formed by the photodissociation of a selected precursor. The embodiments of the present invention directed to the formation of an epitaxial oxide layer will be described first, followed by a description of the process embodiments for the formation of an epitaxial sulfide layer.

In accordance with the first embodiment of the present invention for forming an epitaxial oxide layer, neutral oxygen atoms are formed by the mercury-photosensitized dissociation of a chemically unreactive oxygen-containing precursor, such as nitrous oxide ($N_2O$), molecular oxygen ($O_2$) under selected pressure and flow rate conditions, or nitrogen dioxide ($NO_2$). The term "chemically unreactive" is used herein to denote that a substance will not react with the designated reactants under normal mixture conditions. A reaction chamber 10, in which the chemical vapor deposition reaction occurs, is provided with a quartz window 12, which is integral with the top surface of the reaction chamber 10. The quartz window 12 is transmissive to the selected wavelength of radiation used to initiate the desired photochemical reaction to be discussed below. This constant flood radiation 14 of a selected wavelength is produced by the radiation producing means 16, which may be, for example, an array of low pressure mercury vapor arc lamps. Within the reaction chamber 10, there is a substrate holder 18, which receives a substrate 20 onto which the desired epitaxial oxide layer is to be deposited. The substrate 20 is chosen to provide a preferred crystallographic orientation on which the selected oxide can deposit epitaxially. For example, a sapphire substrate cut on its $(01\bar{1}2)$ crystallographic plane, which is referred to as $(01\bar{1}2)$ sapphire, is used as the substrate for the deposition of epitaxial zinc oxide. Suitable substrates for a chosen epitaxial material are determined by consulting literature references which list the lattice coefficients and coefficients of thermal expansion of various materials, and selecting a substrate material with lattice and thermal coefficients which closely match those of the epitaxial material. In addition, the substrate material selected depends on the device application. For example, a sapphire substrate is used in silicon-on-sapphire devices to provide good isolation between silicon devices; and a gallium aluminum arsenide substrate is used in back-side illuminated GaAs/GaAlAs infrared detectors since GaAlAs is transmissive to infrared radiation.

External to the reaction chamber 10 and adjacent to the bottom surface thereof, there are heating elements 21, which may be formed, for example, of Nichrome wire and are activated by applying a controlled voltage thereto. The heating elements 21 may be used optionally to heat the substrate 20 to the required temperature so that appropriate properties of the deposited layer, such as density, may be obtained. The temperature in the chamber 10 may be maintained as low as room temperature (e.g., 30° C.) or as high as required (e.g., 300° C. or higher). However, since mercury vapor arc lamps, for example, become less efficient at increased temperature, it is necessary to provide external water cooling or an external air or nitrogen cooling source to cool these lamps and remove radiant heat produced by the substrate 20 and substrate holder 18 at certain elevated temperatures. For this purpose, the radiation producing means 16 is completely contained within the enclosure 23, which may be formed of aluminum, and an external cooling means (cooler) 25, such as pipes with water flowing therethrough as shown in FIG. 1 or flowing nitrogen gas, is activated to apply cooling to the enclosure 23. The enclosure 23 is secured to the outside surface of the reaction chamber 10 which surrounds the quartz window 12, but may be removed therefrom as required. Thus, the processing temperature is maintained at a level such that sufficient cooling of the mercury lamps can be accomplished in order to provide efficient lamp performance. The enclosure 23 also provides eye protection to the operator from the radiation 14. Leading from the reaction chamber 10, there is a tube 22 which passes through a valve 24 and then to a vacuum-producing means, such as a pump (not shown), which is used to evacuate the chamber 10 to a sufficiently low pressure to allow the vapor deposition reaction to occur.

External to the reaction chamber 10, there are the chambers 26 and 28 which contain the individual reactant gases for the selected chemical vapor deposition reaction, for example, a metal precursor such as dimethyl zinc and precursor containing oxygen such as nitrous oxide. The chambers 26 and 28 are connected to the control valves or flowmeters 30 and 32, respectively, which are used to control the amounts of reactants which are introduced into a tube 34. Alternatively, for certain process embodiments of the present invention discussed below, there are included a third chamber 27, which contains the precursor of a selected dopant material, such as tetramethyl tin, and a corresponding control valve or flowmeter 31, which controls the amount of dopant precursor introduced from the chamber 27 into the tube 34, where it is mixed with the other reactant gases discussed above.

The reactant gases flow through the tube 34 into a chamber 36 which contains a pool of mercury at room temperature having mercury vapor above it, at a vapor pressure of $10^{-3}$ torr at 30° C. The reactant gases thus become mixed with mercury vapor in the chamber 36 and this reactant gas mixture then passes through a tube 38 and into the reaction chamber 10, where the chemical vapor deposition reaction may be brought about. The components of the apparatus shown in FIG. 1 may be constructed of stainless steel or aluminum, unless otherwise specified. The apparatus shown in FIG. 1 may be used for either a low pressure continuous flow photochemical reactor system, in which there is a continuous influx of reactant gases and removal of reaction by-products during the photochemical reaction process; or for a static photochemical reactor system, in which specified amounts of reactants are introduced into the reaction chamber, the flow of reactant gases is stopped, and then the photochemical reaction process is allowed to occur.

In practicing the present invention in accordance with the first embodiment thereof to deposit an epitaxial oxide layer, the photochemical generation of atomic oxygen is achieved, using the apparatus of FIG. 1 with only two reactant gas chambers (e.g., the chambers 26 and 28). A chemical vapor deposition process is performed as generally described by Werner Kern and Richard S. Rosler in the publication entitled, "Advances in Deposition Processes for Passivation Films," in the *Journal of Vacuum Science and Technology*, Vol. 14, No. 5, Sept.–Oct. 1977, pages 1082–1099, in the discussion of low pressure chemical vapor deposition processes. A suitable substrate, such as sapphire crystal cut on the (01$\bar{1}$2) crystallographic plane, is placed in the reaction chamber 10. The reaction chamber 10 is evacuated by the vacuum-producing means to a predetermined pressure, for example, 1 to 4 torr. (This operating pressure is selected to maximize the mean free path and lifetime of the reactants in order to produce an oxide with good morphology and good step coverage, while at the same time producing practical deposition rates.) The selected vapor phase reactant, such as dimethyl zinc [$Zn(CH_3)_2$], is placed in a chamber such as the chamber 26, and a chemically unreactive oxygen-containing precursor, such as $N_2O$, is placed in a chamber such as the chamber 28. The valves 30 and 32 are set so that the reactants from the chambers 26 and 28, respectively, in a predetermined ratio and at a predetermined flow rate may pass into the tube 34 and then into the chamber 36, which contains a pool of mercury. These reactant gases become mixed with mercury vapor in the chamber 36 and this reactant gas mixture passes from the chamber 36 through the tube 38 into the reaction chamber 10, which is maintained at approximately room temperature (e.g., 30° C.) or up to 200° C. or higher. The reaction temperature is chosen to maximize the quality of the depos-ited oxide, while at the same time minimizing thermal damage to the substrate, as discussed in further detail below. The radiation producing means 16 is activated and produces a constant output of flood radiation 14 of a selected wavelength required to produce the desired photochemical reaction (e.g., 2537 Å to produce mercury in an excited state). The radiation 14 passes through the quartz window 12 into the reaction chamber 10, where it excites the mercury (Hg) atoms in the reactant gas mixture to form mercury atoms in an excited state (Hg*), which is approximately 5 electron volts above normal ground state, but unionized, as shown in Equation (1) below. The Hg* then collides with the oxygen-containing precursor, such as $N_2O$, and causes the precursor to dissociate and produce atomic oxygen (O), as shown in Equation (2a) below.

In addition, the Hg* may react with the selected vapor phase reactant, such as $Zn(CH_3)_2$ to produce a charge-free reactive radical, such as a methyl zinc radical, as shown in Equation (2b) below. Finally, the atomic oxygen reacts with the reactant, $Zn(CH_3)_2$, or the reactive radical thereof, to produce the desired oxide, such as zinc oxide (ZnO), as shown in Equations (3a) and (3b) below. The reactant gas ratio is controlled so that there is no excess zinc, in order to avoid the formation of a zinc-rich ZnO. The by-products of the reactions of Equations (3a) and (3b) comprise hydrocarbon volatiles, such as ethane, dimethyl ether, and higher alkanes $$Hg + h\nu(2537 \text{ Å}) \rightarrow Hg^* \qquad (1)$$

where
h = Planck's constant
$\nu$ = frequency of absorbed radiation $$Hg^* + N_2O \rightarrow N_2 + O + Hg \qquad (2a)$$

$$Zn(CH_3)_2 + Hg^* \rightarrow .Zn(CH_3) + .CH_3 + Hg \qquad (2b)$$

$$Zn(CH_3)_2 + O \rightarrow ZnO + \text{By-products} \qquad (3a)$$

$$.Zn(CH_3) + O \rightarrow ZnO + \text{By-products} \qquad (3b)$$

The reaction of Hg* with Zn(CH$_3$)$_2$ to form the radical thereof as shown in Equation (2b) is a side reaction which is not necessary to the process of the present invention, but leads to the same end product as the major reaction path shown in Equations (1), (2a), and (3a). As indicated previously, the atomic oxygen produced in Equation (2a) above may react directly with the selected vapor phase reactant as described in Equation (3a) above, without first forming an intermediate radical.

Alternatively, the atomic oxygen required for this first process embodiment of the present invention may be formed by the mercury sensitized dissociation of nitrogen dioxide (NO$_2$) to form atomic oxygen and NO. The required atomic oxygen may also be formed by the mercury sensitized dissociation of molecular oxygen in accordance with the Equations (4) and (5) below, or by other known means for forming atomic oxygen from an oxygen-containing precursor by photochemical processes. Since molecular oxygen reacts readily with certain materials by thermal combustion, it is necessary to inhibit such a thermal reaction in order to permit the formation of atomic oxygen as required in the process of the present invention. This inhibition is accomplished by controlling the operating pressure and the ratio or flow rates of the reactant gases. By controlling such process parameters, the thermal oxidation process by molecular oxygen may be prevented and oxidation by atomic oxygen in accordance with the present invention may occur without competing processes.

$$Hg + h\nu(2537 \text{ Å}) \rightarrow Hg^* \qquad (4)$$

$$Hg^* + O_2 \rightarrow 2O + Hg \qquad (5)$$

The selected vapor phase reactant used in this first process embodiment of the present invention comprises a volatile compound containing the metal or cation whose oxide is being formed and which is capable of being oxidized by atomic oxygen to form an epitaxial layer as described herein. Some suitable metal-containing vapor phase reactants are a methyl compound or other alkyl or alkoxy compound, or a chloride compound or other halide compound. For example, epitaxial zirconium oxide may be deposited by the above-described process of the present invention using a zirconium acetylacetonate, Zr(CH$_3$CO)(CHCOCH$_3$)$_4$, reactant, and epitaxial zirconium silicate may be deposited using zirconium acetylacetonate and silane reactants.

Moreover, in practicing the above-described process embodiment of the present invention, as well as the alternative process embodiments described herein, it is advantageous to clean and polish the surface of the selected substrate by known mechanical or chemical processes, prior to depositing the epitaxial oxide layer as described herein.

Further, once the epitaxial oxide layer has been formed by the process of the present invention, the oxide layer may be patterned by etching processes which are known in the art. Such patterned oxide layers might be required, for example, in the formation of integrated circuits or mesa diode array structures.

By the above-described process of the present invention, oxygen atoms are produced by a photochemical process which generates only neutral, charge-free particles. The term "oxygen atom" or "atomic oxygen" is used herein to designate an oxygen atom which is a neutral free-radical having unbonded electrons in its outer electron shell. The presence of these unbonded electrons causes the oxygen atom to be highly reactive, to try to gain two more electrons and form a stable, completed outer electron shell. The term "atomic oxygen" is to be distinguished from "molecular oxygen" (alternately referred to herein as "oxygen" or "O$_2$") which is diatomic and consists of two oxygen atoms joined together by a double bond to form a stable structure. In addition to being neutral (un-ionized) and charge-free, the atomic oxygen used in the present invention is formed in a benign manner which avoids the generation of charged particles or high energy radiation that may damage the substrate or the interface between the substrate and the deposited oxide. Thus, the process of the present invention is charge-free since it is an electrically neutral process which generates no positive or negative particles or ions, or free electrons. Consequently, the process of the present invention avoids the previously discussed prior art problem of substrate damage due to bombardment by charged particles or high energy radiation. It is intended to include within the scope of the present invention not only photochemically generated neutral atomic oxygen, but also any neutral, charge-free oxygen atoms formed in a manner which avoids the generation of charged particles or high energy radiation.

Moreover, by the process of the present invention, reactive species are generated at a relatively low temperature and, thus, enable the deposition of an epitaxial layer to occur at this low temperature. The use of a low temperature in the process of the present invention minimizes the previously-discussed prior art problems of thermal mismatch, undesirable chemical reaction between the epitaxial layer and the substrate, and undesirable autodoping. In addition, the low temperature used in the process of the present invention prevents damage to substrates formed of certain compound semiconductor materials, such as mercury cadmium telluride, indium antimonide, and gallium arsenide, which decompose when exposed to high temperatures.

Further, the process of the present invention produces an epitaxial oxide layer having a smooth surface, which is desirable for optimizing optical transmission in optical and acousto-optical devices and structures.

Thus, the optical polishing step required in the prior art processes previously discussed is not required.

In addition, the process of the present invention produces an epitaxial oxide layer having very low surface defect or pinhole densities, which, in turn, enhances device performance.

Finally, the process of the present invention is highly reproducible, reliable, and capable of a high degree of control over the oxide growth process by, among other things, controlling the initiating radiation for the photochemical reaction.

Epitaxial zinc oxide deposited on (01$\bar{1}$2) sapphire by the above-described process of the present invention is useful for forming active optical waveguide structures and active acousto-optical devices, such as surface acoustic wave devices. Epitaxial zirconium oxide and epitaxial zirconium silicate deposited on a silicon substrate by the process of the present invention are useful as dielectric isolation materials and could be used to replace sapphire in silicon-on-sapphire structures.

Furthermore, the above-described first process embodiment of the present invention may be adapted to deposit an epitaxial oxide layer, such as zinc oxide, having a chosen dopant, such as tin, incorporated therein. Such a doped epitaxial oxide is formed in accordance with the first process embodiment previously described and additionally introducing into the reaction chamber 10 from a chamber, such as the chamber 27, the precursor of a selected dopant atom, such as tetramethyl tin [Sn(CH$_3$)$_4$]. The dopant precursor may react with the Hg* to form a neutral dopant particle or fragment which reacts with the vapor phase reactant and the atomic oxygen to form tin-doped zinc oxide, for example. Alternatively, the dopant precursor itself, rather than a fragment thereof, may react with the vapor phase reactant and the atomic oxygen to form the doped oxide. A tin-doped zinc oxide layer is known to be useful for its electroluminescent properties. Other dopant materials may be used provided they are capable of undergoing the type of photochemical reaction described herein.

In accordance with a second process embodiment of the present invention, for forming an epitaxial oxide layer, the required neutral oxygen atoms are formed by the direct photochemical dissociation of an oxygen-containing precursor, thus eliminating the need for mercury photosensitization. The apparatus shown in FIG. 1 is used except that the chamber 36 which holds the mercury is omitted and only two reactant gas chambers (e.g., chambers 26 and 28) are used.

In practicing the present invention in accordance with the second process embodiment thereof and using the apparatus shown in FIG. 1, omitting the chamber 36 and using only the chambers 26 and 28, the general process described in relation to the first process embodiment of the present invenion is followed, except that no mercury is used for photosensitization. The valves 30 and 32 are set so that the reactant gases, such as Zn(CH$_3$)$_2$ and N$_2$O, from the chambers 26 and 28, respectively, pass in a predetermined ratio and at a predetermined flow rate into the tube 34 and then into the reaction chamber 10. The radiation producing means 16 is activated and produces the constant flood of radiation 14 of a selected wavelength, which is the appropriate wavelength to cause the direct dissociation of the selected oxygen-containing precursor (e.g., 1750–1950 Å for N$_2$O). The flood radiation 14 passes through the window 12, which is formed of a material that is transparent to the wavelength of the radiation 14. The radiation 14 passes into the reaction chamber 10, where it causes the dissociation of the selected oxygen-containing precursor, such as N$_2$O, into atomic oxygen, which then reacts with the selected vapor phase reactant, such as Zn(CH$_3$)$_2$, to form the desired oxide, such as ZnO, as shown in Equations (6) and (7) below. The by-products noted in Equation (7) comprise hydrocarbon volatiles, as previously discussed.

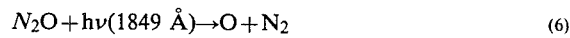
$$N_2O + h\nu(1849 \text{ Å}) \rightarrow O + N_2 \tag{6}$$

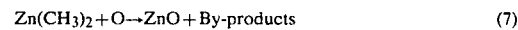
$$Zn(CH_3)_2 + O \rightarrow ZnO + \text{By-products} \tag{7}$$

Alternatively, the atomic oxygen required for this second process embodiment of the present invention may be formed by the direct photochemical dissociation of molecular oxygen as shown in Equation (8) below, or of nitrogen dioxide (NO$_2$) as shown in Equation (9) below, or of similar known materials which are capable of dissociation to atomic oxygen by a direct photochemical process. When a molecular oxygen precursor is used, the operating pressure and reactant gas flow rates must be carefully controlled in order to inhibit any thermal combustion processes, as previously discussed with respect to the first process embodiment of this invention.

$$O_2 + h\nu(1849 \text{ Å}) \rightarrow 2\,O \tag{8}$$

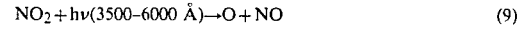
$$NO_2 + h\nu(3500-6000 \text{ Å}) \rightarrow O + NO \tag{9}$$

By the above-described process in accordance with this second embodiment of the present invention, oxygen atoms are generated by a photochemical process which produces only neutral particles. Thus, the previously discussed prior art problems caused by the generation of charged particles and high energy radiation and their bombardment of the substrate have been avoided. The advantages of this second process embodiment of the present invention are the same as those discussed in relation to the first process embodiment previously described. In addition, the process according to this second embodiment has the advantage that no photosensitizing mercury is necessary and thus possible mercury contamination of the epitaxial oxide can be avoided. Further, the apparatus for carrying out the process according to this second embodiment is less complex than an apparatus requiring the use of mercury.

Using this second process embodiment of the present invention, there may be deposited a layer of any of the epitaxial oxide materials discussed above with respect to the first process embodiment of this invention, using the appropriate selected vapor phase metal-containing reactant.

Furthermore, the above-described second process embodiment of the present invention may be adapted to deposit an epitaxial oxide layer, such as zinc oxide, having a chosen dopant, such as tin, incorporated therein. Such a doped epitaxial oxide is formed in accordance with the second process embodiment previously described and additionally introducing into the reaction chamber 10 from a chamber, such as the chamber 27, the precursor of a selected dopant atom, such as tetramethyl tin. The dopant precursor may react with the radiation of the selected wavelength to form a neutral dopant particle or fragment which reacts with the vapor phase reactant and the atomic oxygen to form tin-doped zinc oxide, for example. Alternatively, the dopant precursor itself, rather than a fragment thereof, may react with the vapor phase reactant and the atomic oxygen to form the doped oxide. Other dopant materials may be used provided they are capable of undergoing the type of photochemical reaction described herein.

Turning now to the embodiments of the present invention for depositing an epitaxial layer of a selected sulfide material, there will be discussed process embodiments for depositing epitaxial sulfide layers using a mercury-sensitized photodissociation reaction and using a direct photodissociation reaction. In accordance with a third process embodiment of the present invention, for forming an epitaxial sulfide layer, the apparatus shown in FIG. 1 is used as described in relation to the first process embodiment for forming an epitaxial oxide layer except that a chemically unreactive sulfur-containing precursor is used, rather than an oxygen-containing precursor. Neutral sulfur atoms are generated by the mercury photosensitized dissociation of a chemically unreactive sulfur-containing precursor, such as carbonyl sulfide, hydrogen sulfide, dimethyl sulfide, carbon disulfide, and methyl mercaptan. Using the apparatus shown in FIG. 1, and a selected substrate, such as a silicon or germanium substrate, the reaction chamber 10 is evacuated by the vacuum-producing means to a predetermined pressure, for example, 1 to 4 torr (millimeters of mercury). This operating pressure is selected to maximize the mean free path and lifetime of the reactants in order to produce a sulfide with good morphology and good step coverage, while at the same time producing practical deposition rates. The selected vapor phase reactant, such ss the metal precursor tetraethyl lead [Pb(CH$_2$CH$_3$)$_4$], is placed in a chamber such as the chamber 26, and a chemically unreactive sulfur-containing precursor, such as carbonyl sulfide (COS), is placed in a chamber such as the chamber 28. The valves 30 and 32 are set so that the reactants from the chambers 26 and 28, respectively, in a predetermined ratio and at a predetermined flow rate may pass into the tube 34 and then into the chamber 36, which contains a pool of mercury. These reactant gases become mixed with mercury vapor in the chamber 36 and the reactant gas mixture passes from the chamber 36 through the tube 38 into the reaction chamber 10, which is maintained at approximately room temperature (e.g., 30° C.) or up to 200° C. or higher. The reaction temperature is chosen to maximize the quality of the deposited epitaxial sulfide, while at the same time minimizing thermal damage to the substrate, as discussed in further detail below. The radiation producing means 16 is activated and produces the radiation 14 of a selected wavelength required to produce the desired photochemical reaction (e.g., 2537 Å which is the resonance absorption line to produce mercury in an excited state). The flood radiation 14 passes through the quartz window 12 into the reaction chamber 10, where it excites the mercury (Hg) atoms in the reactant gas mixture to form mercury atoms in an excited state (Hg*), which is approximately 5 electron volts above normal ground state, but unionized, as shown in Equation (10) below. The Hg* then collides with the sulfur-containing precursor, such as COS, transferring energy thereto and causes the precursor to dissociate and produce atomic sulfur (S), as shown in Equation (11a) below.

In addition, the Hg* may react with the selected vapor phase reactant, such as Pb(CH$_2$CH$_3$)$_4$ to produce a charge-free reactive radical, such as a triethyl lead radical, as shown in Equation (11b) below. Finally, the atomic sulfur reacts with the reactant, Pb(CH$_2$CH$_3$)$_4$, or the reactive radical thereof, to produce the desired sulfide, such as lead sulfide (PbS) as shown in Equations (12a) and (12b) below. The reactant gas ratio is controlled in order to control the stoichiometric composition of the sulfide product. The by-products of the reactions of Equations (12a) and (12b) comprise hydrocarbon volatiles, such as ethane, dimethyl sulfide, and higher alkanes.

  (10)

  (11a)

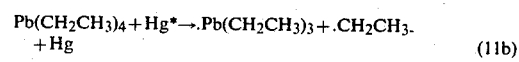  (11b)

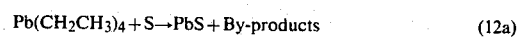  (12a)

  (12b)

The reaction of Hg* with Pb(CH$_2$CH$_3$)$_4$ to form the radicals thereof as shown in Equation (11b) is a side reaction which is not necessary to the process of the present invention, but leads to the same end product as the major reaction path shown in Equations (10), (11a), and (12a). As indicated previously, the atomic sulfur produced in Equation (11a) above may react directly with the selected vapor phase reactant as described in Equation (12a) above, without first forming an intermediate radical.

Alternatively, the atomic sulfur required for this third process embodiment of the present invention may be formed by the mercury-sensitized dissociation of other compounds containing sulfur, such as hydrogen sulfide (H$_2$S), dimethyl sulfide [S(CH$_3$)$_2$] or other dialkyl sulfides, carbon disulfide (CS$_2$), methyl mercaptan [HS(CH$_3$)] and other photo-dissociable sulfur-containing compounds having sufficient vapor pressure to go into the gas phase (e.g., having a vapor pressure of 1 to 3 torr at room temperature). It is noted that upon photodissociation of some of the above-noted sulfur-containing compounds, there may also be produced a certain amount of sulfur-containing molecular fragments, rather than atomic sulfur. While such sulfur-containing molecular fragments may contribute to the formation of a sulfide layer, the quality of the epitaxial sulfide layer so produced may be less desirable than the sulfide layer formed from atomic sulfur. The preferred process embodiment of the present invention comprises the formation of discrete atomic sulfur which reacts with the vapor phase reactant in a controllable manner and without undesired side reactions.

The selected vapor phase reactant used in this third process embodiment of the present invention comprises a volatile compound containing the metal or cation whose sulfide is being formed and which is capable of reaction with sulfur atoms as described herein to deposit an epitaxial layer on a chosen substrate. Some suitable metal-containing vapor phase reactants are a methyl compound or other alkyl or alkoxy compound, a chloride compound or other halide compound, or a hydrogen compound. For example, an epitaxial layer of cadmium sulfide is deposited by the process of the present invention using a dimethyl cadmium reactant.

Moreover, in practicing the above-described third process embodiment of the present invention as well as the alternative process embodiments described herein, it is advantageous to clean and polish the surface of the selected substrate by known mechanical or chemical processes, prior to depositing the epitaxial sulfide layer as described herein.

Further, once the epitaxial sulfide layer has been formed by the process of the present invention, the sulfide layer may be patterned by etching processes which are known in the art.

By the above-described process of the present invention, sulfur atoms are produced by a photochemical dissociation process which generates only neutral, charge-free particles. The term "sulfur atom" or "atomic sulfur" is used herein to designate a sulfur atom which is a neutral species having unbonded electrons in its outer elecron shell. The presence of these unbonded electrons causes the sulfur atom to be highly reactive, to try to gain two more electrons and form a stable, completed outer electron shell. In addition to being neutral (non-ionized) and charge-free, the atomic sulfur used in the present invention is formed in a benign manner which avoids the generation of charged particles or high energy radiation that may damage the substrate or the interface between the substrate and the deposited sulfide. Thus, the process of the present invention is charge-free since it is an electrically neutral process which generates no positive or negative particles or ions, or free electrons. Consequently, the process of the present invention avoids the previously discussed prior art problem of substrate damage due to bombardment by charged particles or high energy radiation. It is intended to include within the scope of the present invention, not only photochemically generated neutral atomic sulfur, but also any neutral, charge-free sulfur atoms formed in a manner which avoids the generation of charged particles or high energy radiation.

Moreover, this third process embodiment of the present invention is performed at a low temperature (e.g., 30° to 200° C.) and thus minimizes thermal mismatches and unwanted chemical reactions, and prevents damage to temperature-sensitive substrates, as discussed in greater detail with respect to the first process embodiment of the present invention. Further, the epitaxial sulfide layer formed by this third process embodiment has a smooth surface morphology and low pinhole density, both of which enhance device performance. In addition, this process embodiment is reproducible, reliable, and capable of a high degree of control over the sulfide growth process by, among other things, controlling the initiating radiation for the photochemical process.

An epitaxial lead sulfide layer deposited on a silicon or germanium substrate by the above-described third process embodiment is useful as the active element in infrared detectors and infrared charge-coupled devices. An epitaxial cadmium sulfide layer can be deposited on an indium oxide substrate by the above-described process for solar cell applications.

Furthermore, the above-described third process embodiment of the present invention may be adapted to deposit an epitaxial sulfide layer, such as lead sulfide, having a chosen dopant incorporated therein. Such a doped epitaxial sulfide is formed in accordance with the third process embodiment previously described and additionally introducing into the reaction chamber 10 from a chamber, such as the chamber 27, the precursor of a selected dopant atom. The dopant precursor may react with the Hg* to form a neutral dopant particle or fragment which reacts with the vapor phase reactant and the atomic sulfur to form the doped sulfide. Alternatively, the dopant precursor itself, rather than a fragment thereof, may react with the vapor phase reactant and the atomic sulfur to form the doped sulfide. Dopant precursors may be used which are capable of the type of photochemcial reaction described herein.

In accordance with the fourth process embodiment of the present invention, for depositing an epitaxial sulfide layer, the required neutral sulfur atoms are formed by the direct photochemical dissociation of a sulfur-containing precursor, thus eliminating the need for mercury photosensitization. The apparatus shown in FIG. 1 is used except that the chamber 36 which holds the mercury is omitted and only two reactant gas chambers (e.g., chamber 26 and 28) are used.

In practicing the present invention in accordance with the fourth process embodiment thereof and using the apparatus shown in FIG. 1, omitting the chamber 36 and using only the chambers 26 and 28, the general process described in relation to the third process embodiment of the present invention is followed, except that no mercury is used for photosensitization. The valves 30 and 32 are set so that the reactant gases, such as $Pb(CH_2CH_3)_4$ and COS, from the chambers 26 and 28, respectively, pass in a predetermined ratio and at a predetermined flow rate into the tube 34 and then into the reaction chamber 10. The radiation producing means 16 is activated and produces the constant flood radiation 14 of a selected wavelength, which is the appropriate wavelength to cause the direct dissociation of the selected sulfur-containing precursor (e.g., 1750–1950 Å for COS). The flood radiation 14 passes through the window 12, which is formed of a material that is transparent to the wavelength of the radiation 14. The radiation 14 passes into the reaction chamber 10, where it causes the dissociation of the selected sulfur-containing precursor, such as COS, into atomic sulfur, which then reacts with the selected vapor phase reactant, such as $Pb(CH_2CH_3)_4$, to form the desired sulfide, such as PbS, as shown in Equations (13) and (14) below. The by-products noted in Equation (14) comprise hydrocarbon volatiles, as previously discussed.

$$COS + h\nu(1849 \text{ Å}) \rightarrow S + CO \tag{13}$$

$$Pb(CH_2CH_3)_4 + S \rightarrow PbS + \text{By-products} \tag{14}$$

Alternatively, the atomic sulfur required for this fourth process embodiment of the present invention may be formed by the direct photochemical dissociation of such compounds as hydrogen sulfide, dimethyl sulfide, carbon disulfide, methyl mercaptan, or of similar materials which are capable of direct dissociation in the gas phase to produce atomic sulfur by a photochemical process as described herein. As previously discussed with regard to the third process embodiment of the present invention, some sulfur-containing molecular fragments may be produced by direct photodissociation of the above-noted compounds and may contribute to the formation of the sulfide layer. However, the preferred embodiment of the present invention comprises the formation of discrete atomic sulfur which reacts with the vapor phase reactant to form the desired sulfide.

By the above-described process in accordance with this fourth embodiment of the present invention, sulfur atoms are generated by a photochemical dissociaiton process which produces only neutral particles. Thus, the previously discussed prior art problems caused by the generation of charged particles and high energy radiation and their bombardment of the substrate have been avoided. The advantages of this fourth process embodiment of the present invention are the same as those previously discussed in relation to the third process embodiment. In addition, the process according to this fourth embodiment has the advantage that no photosensitizing mercury is necessary, and thus possible mercury contamination of the deposited epitaxial sulfide can be avoided. Further, the apparatus for carrying out the process according to this fourth embodiment is less complex than an apparatus requiring the use of mercury.

Using this fourth process embodiment of the present invention, there may be deposited an epitaxial layer of any of the sulfide materials discussed above with respect to the third process embodiment of this invention, using the appropriate selected vapor phase reactant.

Furthermore, the above-described fourth process embodiment of the present invention may be adapted to deposit an epitaxial sulfide layer, such as lead sulfide, having a chosen dopant incorporated therein. Such a doped epitaxial sulfide is formed in accordance with the fourth process embodiment previously described and additionally introducing into the reaction chamber 10 from a chamber, such as the chamber 27, the precursor of a selected dopant atom. The dopant precursor may react with the radiation of the selected wavelength to form a neutral dopant particle or fragment which reacts with the vapor phase reactant and the atomic sulfur to form the doped sulfide. Alternatively, the dopant precursor itself, rather than a fragment thereof, may react with the vapor phase reactant and the atomic sulfur to form the doped sulfide. Dopant precursors may be used which are capable of the type of photochemical reaction described herein.

Turning now to FIG. 2, there is shown the data obtained from an X-ray diffractometer scan of a structure comprising epitaxial zinc oxide on a (01$\bar{1}$2) sapphire substrate, formed in acordance with the first process embodiment of the present invention, as described in Example 1. The curve shown in FIG. 2 presents the relative intensities of X-ray diffraction lines versus $2\theta$, where $\theta$ is the angle of incidence of the X-rays, in degrees. The X-ray diffraction analysis was performed as generally described by Raven et al, in the publication entitled "Structure and Interface Oxidation State of ZnO R. F. Sputtered Onto Silicon and SiO$_2$ Si," in *Thin Solid Films*, Vol. 71, 1980, pages 23-32. The peak A at a $2\theta$ of 56.5 degrees shown in FIG. 2 is characteristic of the (110) plane of zinc oxide and is due to the zinc oxide layer; and the peak B at a $2\theta$ of 52.5 degrees is characteristic of the (024) plane of sapphire and is due to the sapphire (Al$_2$O$_3$) substrate. Thus, the data presented in FIG. 2 shows that a layer of zinc oxide is deposited by the process of the present invention. The epitaxial nature of this ZnO layer is discussed in relation to Example 1.

EXAMPLE 1

This example illustrates the use of the process according to the first embodiment of the present invention as previously described herein in order to deposit an epitaxial layer of zinc oxide (ZnO) on a (01$\bar{1}$2) sapphire substrate.

The apparatus described and illustrated in relation to FIG. 1 was used with two reactant gas chambers. The cleaned and polished (01$\bar{1}$2) sapphire substrate was placed in the reaction chamber 10. Nitrous oxide was used as the oxygen-containing precursor and dimethyl zinc, Zn(CH$_3$)$_2$, was the selected vapor phase reactant. The reaction chamber 10 was evacuated by the vacuum-producing means to a pressure of $10^{-3}$ torr, then backfilled with nitrogen, and again evacuated to a pressure of $10^{-3}$ torr. The flowmeters 30 and 32 were activated to admit the reactant gases in a predetermined ratio into the tube 34 and subsequently into the chamber 36 and the reaction chamber 10, and the reactant gas flow rates were stabilized. The operating pressure within the reaction chamber 10 was adjusted by means of the valve 24 to achieve a pressure of approximately 1 torr. The heating elements 21 and the cooling means 25 were activated. The substrate was heated to a temperature of about 350° C. Finally, the low pressure mercury arc resonance lamps were activated and emitted radiation at 2537 Å, which was absorbed by the mercury vapor in the reaction chamber, producing photo-excited mercury atoms, which collided with the nitrous oxide to form atomic oxygen. The atomic oxygen then oxidized the Zn(CH$_3$)$_2$ to ZnO, which deposited as an epitaxial layer on the surface of the substrate. A continuous flow photochemical reactor system was used, at a total operating pressure of 0.8 torr, a partial pressure of Zn(CH$_3$)$_2$ of 0.16 torr, a partial pressure of N$_2$O of 0.16 torr, and the remainder being nitrogen or inert carrier gas. An epitaxial layer of ZnO having a thickness of 2000 angstroms was deposited at the rate of 500 Å per hour.

The epitaxial nature of a ZnO layer deposited on a (01$\bar{1}$2) sapphire substrate as described above at 350° C., to a thickness of 6000 Å, was determined from analysis of the X-ray diffraction pattern. This analysis was performed as generally described by Maniv and Zangvil, previously referenced herein. A strong substrate orientation effect was observed, with polycrystallites aligned to within ±7 degrees of the crystal direction associated with pure single crystalline growth. In addition, as previously discussed with respect to FIG. 2, the deposited layer was identifed as ZnO by an analysis of the X-ray diffraction lines produced from an X-ray diffractometer scan. Moreover, a layer of ZnO formed as described above and having a thickness of 2000 Å was observed under a scanning electron microscope at a magnification of 20,000 and was found to have a featureless (i.e., smooth) surface morphology.

A structure comprising an epitaxial layer of zinc oxide deposited on a sapphire substrate, formed by the above-described process is useful as an optical waveguide.

EXAMPLE 2

This example illustrates the use of the process according to the fourth embodiment of the present invention as previously described herein, in order to deposit an epitaxial layer of lead sulfide on a germanium substrate.

The apparatus described and illustrated in relation to FIG. 1 is used with two reactant gas chambers. A cleaned and polished germanium substrate having either a (111) or a (100) orientation, such as described by Davis et al previously referenced herein, is placed in the reaction chamber 10. Carbonyl sulfide is used as the sulfur-containing precursor and is contained in the chamber 28, and tetraethyl lead, $Pb(CH_2CH_3)_4$, is used as the selected vapor phase reactant and is contained in the chamber 26. A nitrogen carrier gas is introduced into the chamber 26 in order to carry the organometallic lead compound, which has a low vapor pressure, into the reaction chamber 10. The reaction chamber 10 is evacuated by the vacuum-producing means to a pressure of $10^{-3}$ torr (mm. of mercury), then back-filled with nitrogen, and again evacuated to a pressure of $10^{-3}$ torr in order to purge the system of residual air and water vapor. The flowmeters 30 and 32 are activated to admit the reactant gases in a predetermined ratio into the tube 34 and subsequently into the chamber 36 and the reaction chamber 10, and the reactant gas flow rates are stabilized. The operating pressure within the reaction chamber 10 is adjusted by means of the valve 24 to achieve a pressure of approximately 1 torr. The heating elements 21 and the cooling means 25 are activated. The substrate is heated to a temperature of about 250° C. Finally, the low pressure mercury arc resonance lamps are activated and emit radiation at 1849 Å, which is absorbed by the carbonyl sulfide to cause the dissociation thereof to form atomic sulfur. The atomic sulfur then reacts with the $Pb(CH_2CH_3)_4$ to form PbS, which deposits as an epitaxial layer on the surface of the substrate.

When using a continuous flow photochemical reactor system at an operating pressure of 2 torr (mm. of mercury), typical reactant gas flow rates may be 2 standard cubic centimeters per minute (sccm) of $Pb(CH_2CH_3)_4$, 150 sccm of nitrogen, and 30 sccm of COS.

A structure comprising an epitaxial layer of lead sulfide deposited on a germanium substrate, formed by the above-described process, is useful as an infrared detector element.

While the present invention has been particularly described with respect to the preferred embodiments thereof, it will be recognized by those skilled in the art that certain modifications in form and detail may be made without departing from the spirit and scope of the invention. In particular, the scope of the invention is not limited to the photochemical vapor deposition of epitaxial zinc oxide or epitaxial lead sulfide, which were used merely as examples, but is intended to include the photochemical vapor deposition of any chosen epitaxial oxide or sulfide from a selected gas phase metal-containing reactant that is capable of reacting with atomic oxygen or atomic sulfur to form an oxide or a sulfide. In addition, the chemically unreactive oxygen-containing precursors and sulfur-containing precursors are not limited to the specific materials discussed herein, but are intended to include any material which will photochemically dissociate to atomic oxygen or atomic sulfur with or without mercury sensitization. Further, the scope of the present invention is not limited to the use of mercury as the photosensitizing agent, but is intended to include other known photosensitizing and energy transfer agents, such as cadmium or zinc, and the use of the corresponding wavelength of the resonance line thereof to produce excitation of these photosensitizers. In addition, the process of the present invention is not limited to the specific operating conditions described herein, which were provided merely as examples. In particular, the operating pressure may have a value higher or lower than the pressure specifically described herein.

Moreover, the scope of the present invention is not limited to the photochemical generation of atomic oxygen or atomic sulfur, which was used merely as an example, but is intended to include the use of any neutral, charge-free atomic oxygen or atomic sulfur which is generated at a relatively low temperature and in a manner that avoids the formation of charged particles or radiation which may damage the substrate.

Finally, the process of the present invention is not limited to the particular apparatus described herein, which was used merely as an example, but is intended to include any apparatus suitable for conducting a photochemical reaction of the type described herein. The reaction chamber described herein may have any configuration in which at least a portion thereof is formed of quartz or other material which is transmissive to the selected wavelength of radiation and may comprise, for example, a hollow quartz tube. Further, the process of the present invention may be accomplished in an apparatus in which the source of selected radiation is contained within the reaction chamber, and a transmissive window is not needed.

What is claimed is:

1. A low temperature process for depositing an epitaxial layer of an oxide of a chosen element on the surface of a selected substrate which comprises:
    (a) providing a selected substrate having a preferred crystallographic orientation at the surface thereof; and ined
    (b) exposing said surface at a predetermined temperature to a selected vapor phase reactant containing said element, in the presence of neutral, charge-free oxygen atoms and thereby reacting said oxygen atoms with said reactant in a manner sufficient to form said oxide and induce the crystalline grow th of said oxide as said epitaxial layer on said surface of said substrate while simultaneously avoiding damage to said substrate by charged particles or high energy radiation and minimizing thermal damage to said substrate, wherein the crystal structure of said oxide forms an extension of said preferred crystallographic orientation of said surface of said substrate.

2. The process set forth in claim 1 wherein said neutral, charge-free oxygen atoms are formed by the mercury photosensitized dissociation of a chosen chemically unreactive oxygen-containing precursor.

3. The process set forth in claim 1 wherein said neutral, charge-free oxygen atoms are formed by exposing a chosen chemically unreactive oxygen-containing precursor to radiation of a selected wavelength to cause the direct dissociation of said precursor to form said oxygen atoms.

4. The process set forth in claim 2 or 3 wherein said oxygen-containing precursor is selected from the group consisting of nitrous oxide ($N_2O$), nitrogen dioxide ($NO_2$), or molecular oxygen ($O_2$) under selected pressure and flow rate conditions.

5. The process set forth in claim 1 wherein said selected vapor phase reactant is chosen from the group consisting of dimethyl zinc, zirconium acetylacetonate, and zirconium acetylacetonate mixed with silane.

6. The process set forth in claim 1 wherein said reacting occurs at a temperature in the range of about 30° C. to 300° C.

7. The process set forth in claim 2 wherein:
(a) said selected vapor phase reactant is dimethyl zinc;
(b) said chosen oxygen-containing precursor is nitrous oxide;
(c) said substrate is sapphire oriented along the (O1$\bar{1}$2) crystallographic plane; and
(d) said oxide is zinc oxide.

8. A low temperature process for depositing an epitaxial layer of a sulfide of a chosen element on the surface of a selected substrate which comprises:
(a) providing a selected substrate having a preferred crystallographic orientation at the surface thereof; and
(b) exposing said surface at a predetermined temperature to a selected vapor phase reactant containing said element, in the presence of neutral, charge-free sulfur atoms and thereby reacting said sulfur atoms with said reactant in a manner sufficient to form said sulfide and induce the crystalline growth of said sulfide as said epitaxial layer on said surface of said substrate while simultaneously avoiding damage to said substrate by charged particles or high energy radiation and minimizing thermal damage to said substrate, wherein the crystal structure of said sulfide forms an extension of said preferred crystallographic orientation of said surface of said substrate.

9. The process set forth in claim 8 wherein said neutral, charge-free sulfur atoms are formed by exposing a chosen chemically unreactive sulfur-containing precursor to radiation of a selected wavelength to cause the direct dissociation of said precursor to form said sulfur atoms.

10. The process set forth in claim 8 wherein said neutral, charge-free sulfur atoms are formed by the mercury photosensitized dissociation of a chosen chemically unreactive sulfur-containing precursor.

11. The process set forth in claim 9 or 10 wherein said chemically unreactive sulfur-containing precursor is selected from the group consisting of carbonyl sulfide, hydrogen sulfide, dialkyl sulfide, carbon disulfide, and methyl mercaptan.

12. The process set forth in claim 8 wherein said reacting occurs at a temperature in the range of about 30° C. to 300° C.

13. The process set forth in claim 9 wherein:
(a) said vapor phase reactant is tetraethyl lead;
(b) said sulfur-containing precursor is carbonyl sulfide;
(c) said substrate is germanium; and
(d) said sulfide is lead sulfide (PbS).

* * * * *